Figure 1:
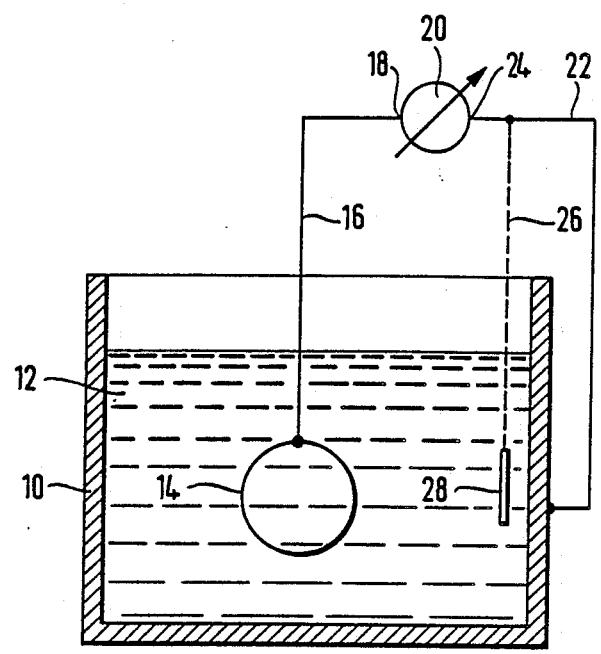

United States Patent [19]

Rinck et al.

[11] Patent Number: 4,969,973
[45] Date of Patent: Nov. 13, 1990

[54] METHOD FOR ETCHING AN ELECTRICALLY CONDUCTIVE LAYER APPLIED TO A SUBSTRATE

[75] Inventors: Helmut Rinck, Langenbach; Helmut Endl, Freising, both of Fed. Rep. of Germany

[73] Assignee: Texas Instruments Deutschland GmbH, Freising, Fed. Rep. of Germany

[21] Appl. No.: 412,970

[22] Filed: Sep. 26, 1989

[30] Foreign Application Priority Data

Sep. 26, 1988 [DE] Fed. Rep. of Germany ....... 3832660

[51] Int. Cl.$^5$ .......................... B44C 1/22; C23F 1/00; C03C 15/00; H01L 21/306
[52] U.S. Cl. ..................................... 156/627; 156/639; 156/656; 156/659.1; 156/665; 156/666; 156/902; 156/662; 156/345
[58] Field of Search ............... 156/626, 627, 639, 656, 156/657, 659.1, 662, 665, 666, 902, 345; 204/129.2

[56] References Cited

U.S. PATENT DOCUMENTS 4,462,856  7/1984  Abe et al. ................. 156/627 X
4,662,975  5/1987  Dufresne et al. ............ 156/345

FOREIGN PATENT DOCUMENTS 58-48671  3/1983  Japan.

Primary Examiner—William A. Powell
Attorney, Agent, or Firm—William E. Hiller; N. Rhys Merrett; Melvin Sharp

[57] ABSTRACT

In the etching by means of an etching solution of an electrically conductive layer applied to a substrate the time profile or variation of the diffusion current flowing between the layer to be etched away and the etching solution is measured. The substrate is removed from the etching solution as soon as the diffusion current passes through a steep drop for the second time and assumes a constant value.

4 Claims, 2 Drawing Sheets

METHOD FOR ETCHING AN ELECTRICALLY CONDUCTIVE LAYER APPLIED TO A SUBSTRATE

The invention relates to a method for etching an electrically conductive layer applied to a substrate by means of an etching solution into which the substrate is immersed.

Methods of this type are generally referred to as wet etching methods because the etching operation is carried out in a liquid etching solution. Such wet etching methods are employed for example in the fabrication of printed-circuit boards which after the etching operation carry a so-called printed circuit with conductor paths of copper on an electrically nonconductive substrate. In addition, such wet etching methods are widely used in the fabrication of integrated semiconductor circuits in the production cycle of which electrically conductive layers are formed several times in succession on semiconductor slices and are selectively etched away again after masking using an etch resist to form desired patterns. By the repeated application of layers and their selective etching in combination with diffusion or implantation steps to generate desired conductivity conditions in the respective remaining structures the integrated circuit with the desired circuit function is finally formed.

On the execution of the wet etching method the substrate is immersed with the layer disposed thereon in the etching solution until the regions to be etched away have been completely removed. However, the duration of the action of the etching solution is a critical parameter in the wet etching method. Firstly, the duration must not be too short because otherwise remnants of the conductive layer to be etched away remain on the substrate. Secondly, an excessively long duration of the action of the etching solution is undesired because it leads to an overetching, i.e. an etching away of regions which lie beneath the etch resist masks and actually should not be removed.

Hitherto for example to determine the end point of the action of the etching solution the substrate was visually observed during the etching operation and taken out of the etching solution as soon as it was observed that the regions to be etched away had been completely removed. To avoid having to observe each substrate during the etching operation in another method for determining the end point of the etching operation test etchings were carried out on the basis of which an etching duration was defined after expiry of which the substrates to be treated were removed from the etching solution. This method however requires exact maintenance of the respective process parameters (concentration of the etching solution, temperature and the like) since otherwise the desired etching result is not achieved simply by observing an exact etching duration. In wet etching methods used to fabricate integrated circuits to determine the end point of the etching infrared transmission measurements were made on the semiconductor slices to be etched, from which it was possible to derive to what extent the layer to be etched away had already been removed. It was also possible to determine by reflection measurements whether the layer to be etched away had already been removed or whether further etching was necessary. The infrared transmission measuring method however requires that the semiconductor slice is permeable to infrared radiation, i.e. cannot be used when for example multilayer metallizations are present. The reflection measurement is also not universally applicable because depending on the particular masks used on the semiconductor slice different reflection conditions exist; this requires a specific adaptation to the particular mask type.

The methods hitherto employed for determining the end point of the etching operation did not allow any conclusions to be made on the overall course of the etching operation and it was thus also not possible to deduce any information on the reliability of the particular etching operation performed.

The invention is based on the problem of providing a method of the type referred to at the beginning with the aid of which the regions of the electrically conductive layer to be etched away can be reliably completely removed without any danger of an undesired overetching. Furthermore, an apparatus is to be provided for carrying out such a method.

To solve this problem the method according to the invention is characterized in that the time variation characteristic of the diffusion current flowing between the layer to be etched and the etching solution is measured and that the substrate is removed from the etching solution as soon as the diffusion current passes for the second time through a steep drop and assumes a constant value.

When using the method according to the invention on the basis of the variation characteristic of the diffusion current flowing during the etching operation it is possible to determine the end point of time at which the substrate must be removed from the etching solution to avoid an undesired overetching. The reaching of this point of time is defined by a distinctive point of the diffusion current variation.

A first embodiment of an apparatus for carrying out the method is characterized in that the etching solution is applied in a container of electrically conductive material and that a terminal of an ammeter used for the diffusion measurement is connected to the layer to be etched and a further terminal to the container.

A second embodiment of such an apparatus for carrying out the method according to the invention is characterized in that the etching solution is disposed in a container of electrically nonconductive material and that a terminal of an ammeter used for the diffusion current measurement is connected to the layer to be etched and a further terminal to an electrode immersed in the etching solution.

Figure 2:
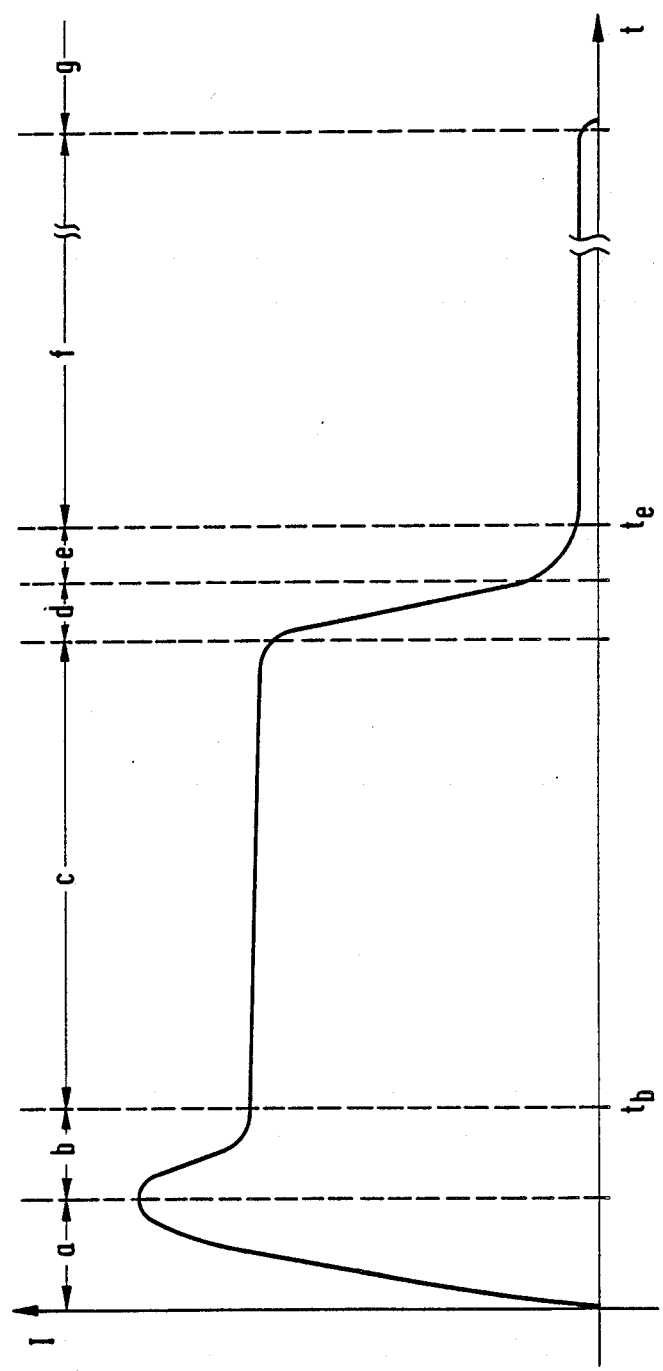

The invention will be explained by way of example with the aid of the drawings, wherein:

FIG. 1 is a fundamental illustration of an apparatus for carrying out the method according to the invention and FIG. 2 is a diagram showing the time variation characteristic of the diffusion current between the layer to be etched and the etching solution.

The apparatus illustrated in FIG. 1 consists essentially of a container 10 containing an etching solution 12. Immersed in the etching solution 12 is a slice 14 of a semiconductor material, for example silicon, on which an electrically conductive layer, not illustrated, is applied which is to be etched away by means of the etching solution at selected regions. The regions which are not to be etched away are covered by an etching protective mask and thus do not come into contact with the etching solution. The principle of selective etching of regions of electrically conductive layers from semiconductor slices is generally known in the art of integrated circuits and consequently no detailed explanations of this principle are necessary here.

The layer to be etched may be a layer of aluminium which is applied on a layer of titanium-tungsten likewise applied to the semiconductor slice 14. To etch the aluminium layer away an etching solution is used which attacks aluminium but not the titanium-tungsten layer.

It is pointed out here that the workpiece immersed in the etching solution 12 may also be a plastic board laminated with copper as generally employed in printed-circuit board fabrication. In this case, on the copper layer selected regions are provided with an etching protective mask whilst the exposed regions can come into contact with the etching solution 12 and thus etched away. As final result, the printed-circuit board produced after the etching operation carries on one or both sides a printed circuit with conductor paths which connect in desired manner the electrical components to be attached to the printed-circuit board.

The etching method to be described can be used both in the former case (i.e. in the fabrication of integrated circuits, and in the latter case, i.e. in the manufacture of printed-circuit boards.

In the semiconductor slice illustrated in FIG. 1 the layer to be etched away is contacted by means of a conductor 16 which is connected to a terminal 18 of an ammeter 20. A further conductor 22 which is connected to the second terminal 24 of the ammeter 20 is electrically connected to the container 10 which consists of an electrically conductive material, for example special steel. If the container 10 is made of a plastic material the second terminal 24 of the ammeter 20 is connected via a conductor 26 to an electrode 28 which is immersed in the etching solution 12.

After immersing the semiconductor slice 14 into the etching solution 12 a diffusion current having a characteristic profile in the course of the etching of the layer to be removed flows through the ammeter 20. This profile is shown by the diagram in FIG. 2.

In FIG. 2 the diffusion current I is shown as a function of the time t. The variation of the diffusion current shows seven characteristic regions a to g which can be explained as follows:

In the region a the diffusion current I increases from the value 0 to a maximum value. This region results on immersion of the semiconductor slice into the etching solution. The maximum current flows at the transition between the regions a and b when the semiconductor slice 14 is completely immersed and the layer to be etched away is still completely present. The current value is directly proportional to the surface area of the layer to be etched away. The current drop in the region b is due to the layer to be etched initially having a relatively rough and thus large surface area which after the start of the etching operation is smoothed and consequently becomes smaller. This operation is referred to in etching of aluminium as brightening. The end time point $t_b$ of the first steep current drop is reached when the surface roughness is eliminated and the actual etching operation begins which takes place in the region c. The instant $t_b$ could be used in brightening aluminium as the point of termination of the brightening process.

As mentioned, the region c is the actual etching region in which the surfaces of the layer not covered by an etching protective mask are etched away. In this region c the current is almost constant. In the region d a pronounced drop of the diffusion current is to be observed. This drop occurs when the layer has been etched away to such an extent that the layer thereeneath, which cannot be attacked by the etching solution, is exposed. At this instant the surface accessible for the etching solution decreases very rapidly and consequently the diffusion current also falls rapidly. In the region e the state is reached where all the exposed surface areas of the layer to be etched away have been etched away. The diffusion current at this instant does not drop completely to the value 0 because the etching solution is still in contact with the edges of the surface areas of the layer covered by the etching protective mask. If the semiconductor slice 14 is now left in the etching solution overetching occurs, i.e. removal of the metal layer beneath the etching protective mask, which is however undesirable. In this overetching range, i.e. in the diagram of FIG. 2 in the region f, the diffusion current retains a constant low value because the end faces of the layer disposed beneath the etching protective mask and exposed to the etching solution always remain of the same magnitude. The region g is reached when the entire layer is removed from the semiconductor slice 14, i.e. including the areas of which removal should in fact have been prevented by the etching protective mask. As soon as the layer is completely removed the diffusion current of course drops to the value 0.

It is apparent from the above description of the diffusion current variation that the desired etching operation should be terminated at the transition from the region e to the region f because this is where the undesired overetching starts. To terminate the etching operation in the desired manner the diffusion current variation is therefore observed and the semiconductor slice 14 is removed from the etching solution when the diffusion current assumes a constant value after passing through a steep drop. In the diagram of FIG. 2 this end point is denoted by $t_e$.

Detection of the diffusion current variation also permits valuable conclusions to be made on the course of the etching operation. For example, from the absolute magnitude of the diffusion current it is possible to deduce the exposed surface area of the layer to be etched away, the etching temperature obtaining and also the alloy composition of the layer to be etched away. The slope of the curve in the region d permits conclusions to be made on the uniformity of the etching.

In a practical example it was found that in semiconductor slices which are used to make integrated circuits a current density in the region of 3 mA per $cm^2$ aluminium surface to be etched can be measured. Informative current values can be measured down to a residual aluminium area of about 1 $mm^2$.

The method described can be used very universally also in etching apparatuses in which a relatively large number of semiconductor slices are treated at the same time. In this case as well the determination of the end point of the etching can be effected with the aid of the diffusion current variation. Since with correctly set process parameters the same diffusion current variation is always to be expected, by storing several consecutive diffusion current variations it is possible to make comparisons between the variation just detected and the previous variations. When deviations are detected a fault alarm can be generated showing the operator that one of the process parameters does not have the correct value which could result in rejects. The operator can then intervene and if necessary correct the faulty process parameter.

We claim:

1. A method of etching an electrically conductive layer applied to a substrate, said method comprising:

immersing the substrate on which the electrically conductive layer is disposed in an etching solution;

selectively etching the electrically conductive layer by the etching solution while the substrate on which the electrically conductive layer is disposed is immersed in the etching solution;

measuring the diffusion current flowing between the electrically conductive layer and the etching solution as the electrically conductive layer is being etched by the etching solution;

monitoring the measurement of the diffusion current; and removing the substrate from the etching solution as soon as the measured diffusion current passes for the second time through a steep drop and assumes a constant value.

2. A method as set forth in claim 1, further including:

storing the time variation of the diffusion current of a plurality of previous etching operations employing a substrate with an electrically conductive layer applied thereto as immersed in an etching solution wherein the substrate, the electrically conductive layer applied thereto, and the etching solution are respectively the same materials for each of the previous etching operations;

comparing the time variation of the diffusion current in a present etching operation with the stored time variations of the diffusion current of the previous etching operations; and generating a fault alarm if a deviation of the time variation of the diffusion current in the present etching operation from the stored time variations of the diffusion current of the previous etching operations as compared thereto is detected.

3. A method as set forth in claim 1, wherein the measurement of the diffusion current is accomplished by attaching the terminals of a diffusion current measuring instrument to the electrically conductive layer on the substrate and to an electrically conductive container;

placing the etching solution in which the substrate having the electrically conductive layer thereon is to be immersed in the electrically conductive container;

thereafter immersing the substrate having the electrically conductive layer thereon in the etching solution; and determining the diffusion current from the diffusion current measuring instrument.

4. A method as set forth in claim 1, wherein the measurement of the diffusion current is accomplished by attaching the terminals of a diffusion current measuring instrument to the electrically conductive layer on the substrate and to an electrode;

immersing the electrode in the etching solution along with the substrate having the electrically conductive layer thereon; and determining the diffusion current from the diffusion current measuring instrument.

* * * * *